(12) United States Patent
Arsovski et al.

(10) Patent No.: US 10,748,635 B2
(45) Date of Patent: Aug. 18, 2020

(54) DYNAMIC POWER ANALYSIS WITH PER-MEMORY INSTANCE ACTIVITY CUSTOMIZATION

(71) Applicant: MARVELL INTERNATIONAL LTD., Hamilton (BM)

(72) Inventors: Igor Arsovski, Williston, VT (US); Kyle M. Holmes, Wappingers Falls, NY (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 15/928,587

(22) Filed: Mar. 22, 2018

(65) Prior Publication Data
US 2019/0295676 A1    Sep. 26, 2019

(51) Int. Cl.
*G11C 29/12*    (2006.01)
*G11C 29/50*    (2006.01)

(52) U.S. Cl.
CPC ............ *G11C 29/12* (2013.01); *G11C 29/50* (2013.01); *G11C 2029/5006* (2013.01)

(58) Field of Classification Search
CPC .. G11C 29/12; G11C 29/50; G11C 2029/5006
See application file for complete search history.

(56) References Cited

U.S. PATENT DOCUMENTS

| | | | | |
|---|---|---|---|---|
| 5,983,355 A * | 11/1999 | Kenny | ...................... | G06F 1/00 713/322 |
| 6,182,257 B1 | 1/2001 | Gillingham | | |
| 6,321,320 B1 * | 11/2001 | Fleischman | .......... | G11C 29/028 711/101 |
| 7,269,766 B2 * | 9/2007 | Slobodnik | .............. | G11C 29/16 714/718 |
| 8,090,965 B1 | 1/2012 | Chakravarty | | |
| 9,588,177 B1 * | 3/2017 | Atwood | ........... | G01R 31/31707 |
| 2005/0034089 A1 * | 2/2005 | McGuffin | ................ | G06F 30/33 716/109 |
| 2005/0050495 A1 * | 3/2005 | McGuffin | ................ | G06F 30/33 716/109 |
| 2006/0009959 A1 * | 1/2006 | Fischer | ................. | G06F 30/367 703/18 |
| 2006/0242515 A1 * | 10/2006 | Alvamani | ........ | G01R 31/31854 714/729 |
| 2007/0157035 A1 * | 7/2007 | Gumma | ................. | G06F 1/206 713/300 |
| 2008/0046789 A1 * | 2/2008 | Arsovski | ................ | G11C 29/12 714/733 |
| 2011/0298474 A1 * | 12/2011 | Cheruiyot | .............. | G01R 29/26 324/613 |

(Continued)

OTHER PUBLICATIONS

Jian Liu et al., "Dynamic Power Supply Current Testing of CMOS SRAMs", 0-8186-8277-9/98,1998 IEEE, 6 pages.

(Continued)

*Primary Examiner* — Mushfique Siddique

(57) ABSTRACT

The present disclosure relates to a device including a built-in-self-test (BIST) circuit configured to run a BIST pattern in a loop mode on a memory which is customized for activity factors corresponding to a programmable number of operations, the BIST circuit being further configured to measure dynamic power on a supply while running the BIST pattern in the loop mode on the memory.

18 Claims, 2 Drawing Sheets

(56) References Cited

U.S. PATENT DOCUMENTS

2014/0053003 A1\* 2/2014 Moyer .................. G06F 21/755
 713/300
2014/0249782 A1\* 9/2014 Cummings ......... G06F 17/5036
 703/2

OTHER PUBLICATIONS

Shyang-Tai Su et al.,"Testing of Static Random Access Memories by Monitoring Dynamic Power Supply Current", Journal of Electronic Testing: Theory and Applications, 3, 265-278 (1992),1992 Kluwer Academic Publishers, Boston, MA, 14 pages.

\* cited by examiner

DYNAMIC POWER ANALYSIS WITH PER-MEMORY INSTANCE ACTIVITY CUSTOMIZATION

FIELD OF THE INVENTION

The present disclosure relates to measuring dynamic power on chips, and more particularly, to a circuit and a method for measuring dynamic power on chips using a built-in-self-test which allows per-memory instance activity customization.

BACKGROUND

Built-in-self-test (BIST) is an important tool for testing memories (including finding/diagnosing and repairing defects within those memories). As more memory is integrated into chips, thorough BIST test and repair is a requirement in order to ensure reasonable product quality/reliability levels. To improve BIST quality, oftentimes more test patterns are run as part of a manufacturing test. But, total test time can take many millions of cycles when all test patterns are included. This is extremely time consuming.

In addition, logic power measurements in BIST are prone to error due to different logic placement and metal routing on each design. Further, typical power measurements for high volume production do not account for dynamic power on chips, even though dynamic power can take up the majority of total power in modern chips.

SUMMARY

In an aspect of the disclosure, a device includes a built-in-self-test (BIST) circuit configured to run a BIST pattern in a loop mode on a memory which is customized for activity factors corresponding to a programmable number of operations, the BIST circuit being further configured to measure dynamic power on a supply while running the BIST pattern in the loop mode on the memory.

In another aspect of the disclosure, a circuit includes a built-in self-test (BIST) control configured to route a plurality of activity factors to a BIST circuit, the built-in self-test (BIST) circuit includes at least one activity register configured to store a programmable value, and the BIST circuit is configured to run a BIST pattern in a loop mode on a memory and measure dynamic power on a supply while running the BIST pattern in the loop mode on the memory.

In another aspect of the disclosure, a method includes inputting a plurality of activity factors to a built-in self-test (BIST) circuit to define a BIST pattern, exercising the BIST pattern in a loop mode on a memory, measuring current on a supply while exercising the BIST pattern in the loop mode on the memory; and calculating dynamic power on the supply based on the measured current on the supply while exercising the BIST pattern in the loop mode on the memory.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
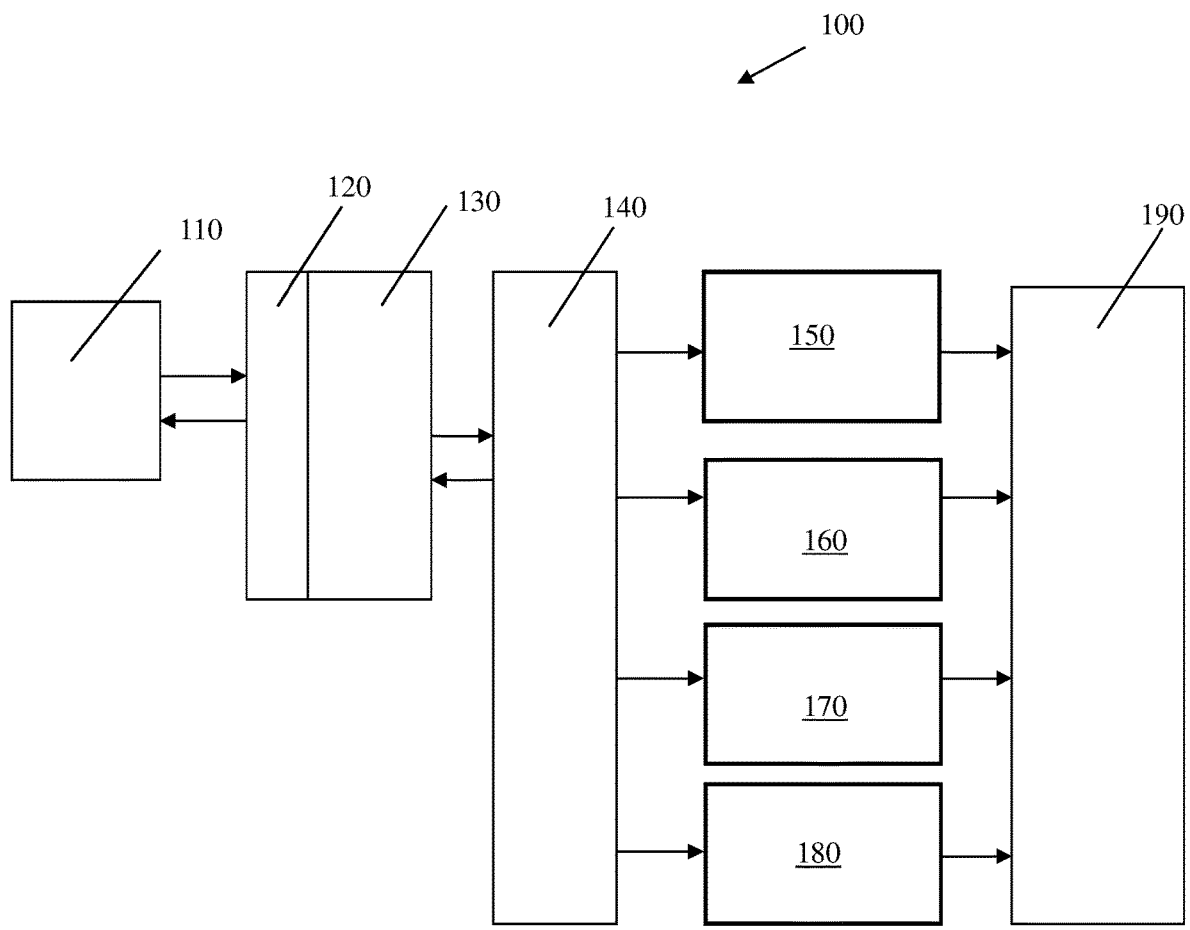
FIG. 1 shows a memory chip circuit using a BIST in accordance with aspects of the present disclosure.

The present disclosure relates to measuring dynamic power on chips, and more particularly, to a circuit and a method for measuring dynamic power on chips using a built-in self-test (BIST) which allows per-memory instance activity customization. In more specific embodiments, the present disclosure comprises a method for measuring dynamic power on chips using a BIST which allows for customization on memory activation factors for read, write, search, etc., on a per memory instance basis. Advantageously, the present disclosure enables customer design power to power-tool predication correlation.

In conventional power measurement tools, logic power measurements are prone to error due to different logic placement and metal routing on each design. Further, dynamic power on chips is not typically measured even though dynamic power can take up the majority of total power; instead, only leakage power is measured. In addition, it is difficult to correlate customer power to power measurement during manufacture due to different memory activity on each memory instance. Further, conventional power measurement tools are not customized for chip content and do not reflect any specific application. Also, power measurements are difficult to coordinate with customers due to differences in application and test conditions.

In implementations described herein, dynamic power can be measured directly on the memory or a chip memory. The measurements can also be customized for activity factors based on a custom application of a customer. These activity factors can include, e.g., search activities, read activities and write activities, amongst others. Also, in embodiments, the dynamic power measurements can be easily duplicated using a model to hardware correlation, at a wafer final test during manufacturing, at a module final test, or using a customer's board. In an example, a memory chip can be modeled with a BIST circuit and at least one activity register based on activity factors of the customer to determine dynamic power measurements. In another embodiment, it is possible to now use a power prediction tool to correlate a memory chip to specific activity factors of a custom designed memory. Thus, dynamic power measurement can be power optimized and fed back to the customer to be correlated with customer power requirements. Further, it is now possible to correlate power supply integrity and noise. This can be accomplished by a method which includes inputting a plurality of activity factors to a BIST circuit to define a BIST pattern, exercising the BIST pattern in a loop mode on a memory, and measuring dynamic power on a supply while exercising the BIST pattern in the loop mode on the memory.

In embodiments, circuits and methods of measuring dynamic power can be applied to models, hardware correlations, and customer parts. Further, customer specific activations can be applied on specific memory instances by using per memory instance registers. For example, different memory instances on a chip can have different activity factors when programmed from outside the chip. The methods and circuits of measuring dynamic power can also be replicated on any design to provide relevant power for any specific chip. Further, a BIST can be used to measure dynamic power and, accordingly, the dynamic power measurements could give the same power regardless of the location or placement on a chip (because power is measured on a hard macro). In fact, the BIST described herein can be modified without greatly increasing the circuit complexity.

Further, the circuits and methods described herein may run when dynamic power measurement is needed.

FIG. 1 shows a memory chip circuit using a BIST in accordance with aspects of the present disclosure. In FIG. 1, the memory chip 100 includes a BIST control 110. In embodiments, the BIST control 110 can direct the BIST circuit portion on which patterns to run (e.g., a checkerboard pattern). Further, activity factors can be routed through the BIST control 110. For example, activity factors can include read, write, search, and any other activity factors. A BIST control (BC) interface 120 can either send or receive data from the BIST control 110.

A BIST engine 130 can either send or receive data from a BIST I/O 140. In turn, the BIST I/O 140 can send data to different registers, e.g., read activity register 150, write activity register 160, search activity register 170, and any other activity register 180. The programmable values of activity factors (e.g., read activity, write activity, search activity, or any other activity factor corresponds with a read operation, a write operation, a search operation, and any other modes of operation, respectively) are stored in their corresponding read activity register 150, write activity register 160, search activity register 170, and any other activity register 180. In embodiments, the programmable value can be a delay which corresponds to an operation for the read activity register 150, the write activity register, the search register 170, and any other activity register 180.

Further, in FIG. 1, the read activity register 150, the write activity register 160, the search activity register 170, and any other activity register 180 can be physically on the memory chip 100, e.g., in a BIST circuit portion of the memory chip 100. In such an implementation, as the BIST circuit portion is built into the memory chip 100, dynamic power can be measured at any time. In other embodiments, the read activity register 150, the write activity register 160, the search activity register 170, and any other register 180 can be stored outside the BIST circuit portion and can be connected to control pins, as an example.

In FIG. 1, a read access memory (RAM) 190 can be a static random access memory (SRAM), a dynamic random access memory (DRAM), or a ternary content addressable memory (TCAM). In an example, the memory 190 can be used with a search register 170 to determine dynamic power measurement for a search activity (i.e., a search operation). In embodiments, the specific activities stored in the specific registers, e.g., registers 150, 160, 170, 180 can be applied to the memory 190. In this way, the BIST circuit can be configured to run a BIST pattern in a loop mode on the memory 190, which is customized for activity factors corresponding to a programmable number of operations. In addition, the BIST circuit is configured to measure dynamic power on a supply while running the BIST pattern in the loop mode on the memory 190.

As an example of operation, a customer can apply the exact activity factor on each memory instance they import into a power prediction tool (e.g., power spreadsheet) to obtain a good power correlation. More specifically, the read activity register 150 can store a number of the read activity factor. The number of the read activity factor corresponds with a delay for the read operation. Then, the BIST circuit portion can exercise the RAM 190 with a BIST pattern (e.g., corresponding to the read activity factor) to determine how often the BIST circuit portion is switching to the RAM 190 with the extra delay from the read activity factor stored in the read activity register 150. In particular, the BIST circuit portion can exercise the RAM 190 by going through a specific number of cycles with the extra delay stored in the read activity register 150 to measure the dynamic power of the read activity factor. Further, the BIST circuit portion can exercise the RAM 190 with a BIST pattern that corresponds to a plurality of activity factors.

In FIG. 1, as another illustrative example, an activity factor can be specified for read and write operations in each memory instance to match the customer application. In a default situation (i.e., if no specific activity factor conditions are given), the activity factor can default to 50% read operations and 50% write operations; although other defaults or customizations are also contemplated herein. A customer can input specific activity factors (i.e., a 60% read activity factor and a 40% write activity factor, etc.) to approximate different designed functions of a circuit. In this way, the customer can customize the activity factors based on custom applications; that is, the activity factor can be specified for read and write in each memory to match a particular custom application. The BIST circuit portion can then exercise the RAM 190 with a pattern to obtain dynamic power measurements of the memory instances using the activity factors. Therefore, by using the exact activity factors of a customer, a more accurate dynamic power measurement of the memory instances can be obtained.

Further, it is contemplated herein that the dynamic power measurements can be performed by measuring current on a supply while running the pattern through the BIST circuit portion. In addition, since the BIST can be built into the chip, it can be used to measure power at almost any time. This same process can also be used to correlate power supply integrity/noise, which can be critical for scaled up performance.

Figure 2:
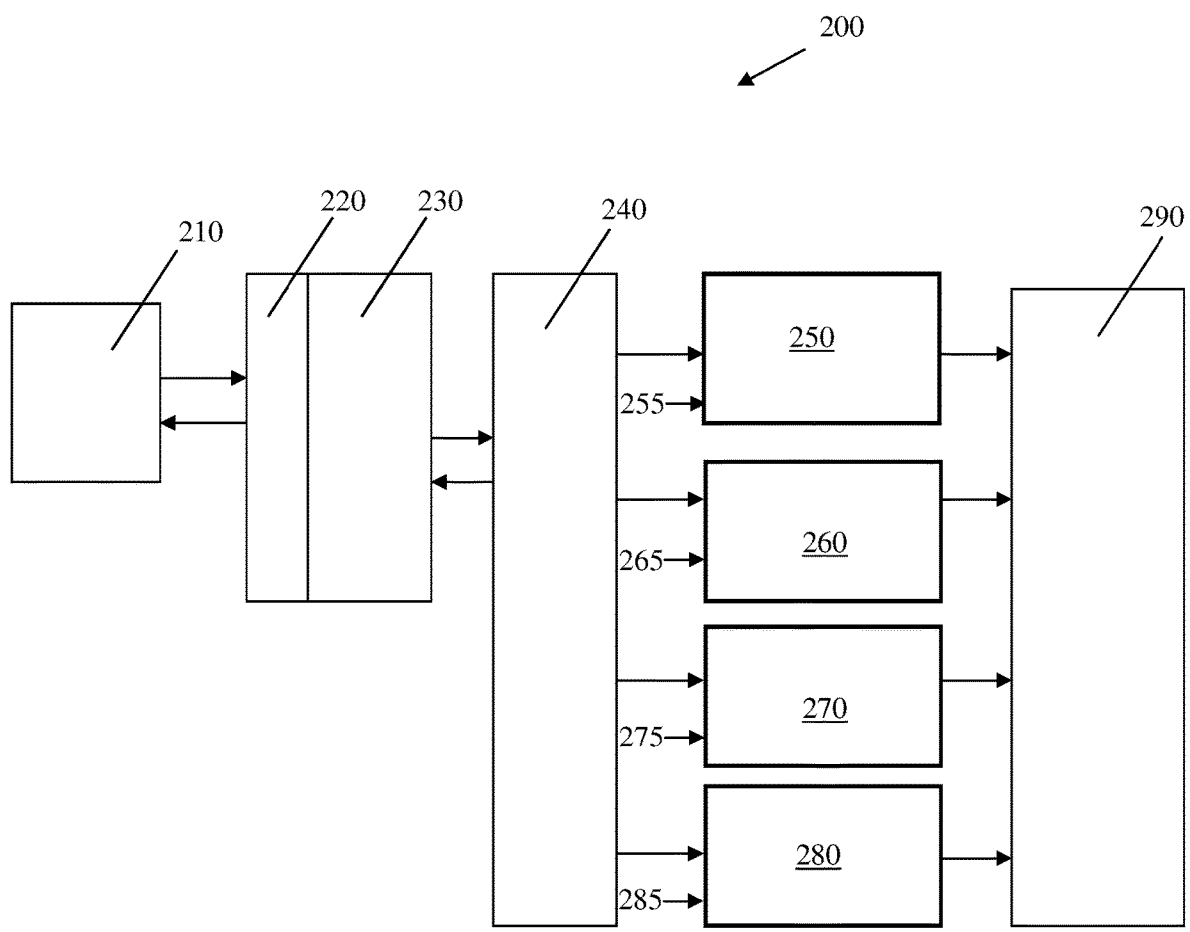
FIG. 2 shows another memory chip using a BIST in accordance with aspects of the present disclosure.

FIG. 2 shows another memory chip using a BIST in accordance with aspects of the present disclosure. FIG. 2 is similar to FIG. 1, except that the activity registers 250, 260, 270, and 280 each receive data from separate corresponding inputs 255, 265, 275, and 285. The remaining functional and particular components remain the same, i.e., the memory chip 200 includes a BIST control 210, a BC interface 220, a BIST engine 230, a BIST I/O (BIO) 240, a read activity register 250, a read activity register input 255, a write activity register 260, a write activity register input 265, a search activity register 270, a search activity register input 275, any other register 280, any other register input 285, and a read access memory (RAM) 290.

As an example of an operation using the memory of FIG. 2, the read activity register 250 can receive a number of the read activity factor that corresponds to a delay for the read operation from a read activity register input 255 (i.e., outside a BIST circuit portion) and store the number. Then, the BIST circuit portion can exercise the RAM 290 with a BIST pattern (e.g., corresponding to the read activity factor) to find out how often the BIST circuit portion is switching to the RAM 290 with the extra delay from the read activity factor stored in the read activity register 250. In particular, the BIST circuit portion can exercise the RAM 290 by going through a specific number of cycles with the extra delay stored in the read activity register 250 to measure the dynamic power of the read activity factor. Further, the BIST circuit portion can exercise the RAM 290 with a BIST pattern that corresponds to a plurality of activity factors.

In FIG. 2, as an example, a customer can apply the exact activity factors on each memory instance into a power predication tool and get a good power correlation. In other words, an activity factor can be specified for read and write operations in each memory to match the customer application. In a default situation (i.e., if no specific activity factor conditions are given), the activity factor can default to 50% read operations and 50% write operations. Therefore, a customer can input specific activity factors (i.e., a 50% read activity factor and a 50% write activity factor) through the read activity register input 255 and the write activity register input 265 to approximate customer functions and then the BIST circuit portion can exercise the RAM 290 with a pattern to obtain dynamic power measurements. Therefore, by using the exact activity factors of a customer, a more accurate dynamic power measurement can be obtained. Further, the dynamic power measurements can be performed by measuring current on a supply while running the pattern through the BIST circuit portion.

The circuit and the method for measuring dynamic power on chips using a built-in self-test which allows per-memory instance activity customization of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and a method for measuring dynamic power on chips using a BIST which allows per-memory instance activity customization of the present disclosure has been adopted from integrated circuit (IC) technology. For example, the structures are built on wafers and are realized in films of material patterned by photolithographic processes on the top of a wafer. In particular, the fabrication of the circuit and a method for measuring dynamic power on chips using a built-in self-test which allows per-memory instance activity customization uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A device comprising:
    a built-in-self-test (BIST) circuit configured to (i) run a BIST pattern of a BIST in a loop mode on a memory, wherein the BIST pattern is customized for activity factors of a customer application of the memory, wherein the activity factors correspond to a programmable number of operations to perform during the BIST of the memory, and (ii) measure a dynamic power level of a power supply while running the BIST pattern in the loop mode on the memory,
    wherein the activity factors include a read activity factor, a write activity factor, and a search activity factor, which correspond respectively to a read operation, a write operation, and a search operation; and
    a read activity register, a write activity register, and a search activity register, which are disposed outside the BIST circuit and used to store the activity factors.

2. The device of claim 1, wherein the read activity register, the write activity register, and the search activity register each receive an input from outside the BIST circuit.

3. The device of claim 1, wherein the read activity register, the write activity register, and the search register each store a programmable value that corresponds to a respective one of the activity factors.

4. The device of claim 3, wherein the programmable values are delays which correspond to operations for the read activity register, the write activity register, and the search activity register.

5. The device of claim 1, wherein the memory is one of a static random access memory (SRAM), a dynamic random access memory (DRAM), and a ternary content addressable memory (TCAM).

6. The device of claim 1, wherein the BIST circuit is further configured to measure dynamic power of the supply by measuring current of the supply while running the BIST pattern in the loop mode on the memory.

7. The device of claim 1, further comprising exercising a specific number of cycles in the memory with an extra delay stored in the read activity register to measure a dynamic power level associated with the read activity factor.

8. The device of claim 7, further comprising specifying the programmable number of operations to include half read operations and half write operations.

9. The device of claim 8, further comprising modeling a memory chip with the BIST circuit and at least one activity register based on the activity factors.

10. The device of claim 9, further comprising performing a dynamic power measurement based on the modeled memory chip and feeding back the determined dynamic power measurement to improve power requirements.

11. A method of operating a built-in-self-test circuit, the method comprising:
    receiving activity factors at a BIST circuit for a BIST of a memory,
    wherein the activity factors are for a particular customer application of the memory, and
    wherein the BIST circuit includes activity registers configured to store programmable values corresponding to the activity factors;
    running a BIST pattern in a loop mode on the memory; and
    measuring a dynamic power level of a power supply while running the BIST pattern in the loop mode on the memory,
    wherein the activity registers include a read activity register, a write activity register, and a search activity register, which are disposed outside the BIST circuit and used to store the activity factors.

12. The method of claim 11, further comprising receiving an input from outside the BIST circuit at the read activity register, the write activity register, and the search activity register.

13. The method of claim 11, wherein the programmable values are delays which correspond respectively to operations for the read activity register, the write activity register, and the search activity register.

14. The method of claim 11, wherein the activity factors include a read activity factor, a write activity factor, and a search activity factor which correspond respectively to a read operation, a write operation, and a search operation.

15. The method of claim 11, wherein the memory is one of a static random access memory (SRAM), a dynamic random access memory (DRAM), and a ternary content addressable memory (TCAM).

16. The method of claim 11, further comprising measuring a current level of the power supply while running the BIST pattern in the loop mode on the memory.

17. A method comprising:
inputting activity factors to a built-in-self-test (BIST) circuit to define a BIST pattern of a BIST, wherein the BIST pattern is customized for a customer application of a memory;
exercising the BIST pattern in a loop mode on the memory;
measuring a current level of a power supply while exercising the BIST pattern in the loop mode on the memory;
calculating a dynamic power level on the power supply based on the measured current level while exercising the BIST pattern in the loop mode on the memory; and
providing a read activity register, a write activity register, and a search activity register outside the BIST circuit,
wherein the activity factors include a read activity factor, a write activity factor, and a search activity factor corresponding respectively to a read operation, a write operation, and a search operation, and
wherein the read activity register, the write activity register, and the search activity register store the read activity factor, the write activity factor, and the search activity factor, respectively.

18. The method of claim 17, wherein the memory is one of a static random access memory (SRAM), a dynamic random access memory (DRAM), and a ternary content addressable memory (TCAM).

* * * * *